(12) United States Patent
Lines

(10) Patent No.: US 7,535,749 B2
(45) Date of Patent: *May 19, 2009

(54) DYNAMIC MEMORY WORD LINE DRIVER SCHEME

(75) Inventor: Valerie L. Lines, Ottawa (CA)

(73) Assignee: Mosaid Technologies, Inc., Kanata, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/396,306

(22) Filed: Mar. 30, 2006

(65) Prior Publication Data

US 2007/0025137 A1 Feb. 1, 2007

Related U.S. Application Data

(63) Continuation of application No. 10/791,437, filed on Mar. 2, 2004, now Pat. No. 7,038,937, which is a continuation of application No. 10/463,194, filed on Jun. 17, 2003, now abandoned, which is a continuation of application No. 09/919,752, filed on Jul. 31, 2001, now Pat. No. 6,603,703, which is a continuation of application No. 09/548,879, filed on Apr. 13, 2000, now Pat. No. 6,278,640, which is a continuation of application No. 09/123,112, filed on Jul. 27, 1998, now Pat. No. 6,061,277, which is a continuation of application No. 08/705,534, filed on Aug. 29, 1996, now abandoned, which is a continuation of application No. 08/611,558, filed on Mar. 6, 1996, now Pat. No. 5,751,643, which is a continuation-in-part of application No. 08/515,904, filed on Aug. 16, 1995, now Pat. No. 5,822,253, which is a continuation of application No. 08/205,776, filed on Mar. 3, 1994, now abandoned, which is a continuation of application No. 08/031,898, filed on Mar. 16, 1993, now abandoned, which is a continuation of application No. 07/680,746, filed on Apr. 5, 1991, now Pat. No. 5,214,602.

(30) Foreign Application Priority Data

Apr. 6, 1990 (GB) .................................. 9007790.0

(51) Int. Cl.
*G11C 11/24* (2006.01)
(52) U.S. Cl. .................. 365/149; 365/154; 365/189.12; 365/230.01
(58) Field of Classification Search ................. 365/149, 365/150, 230.06, 154, 189.12, 230.01
See application file for complete search history.

(56) References Cited

U.S. PATENT DOCUMENTS 3,761,899 A   9/1973   McKenny et al.
(Continued)

FOREIGN PATENT DOCUMENTS

EP            0010137 A1    4/1980
(Continued)

OTHER PUBLICATIONS

Kitsukawa, Goro, et al., "An Experimental 1-Mbit BiCMOS DRAM," *IEEE Journal of Solid-State Circuits*, V. SC-22, No. 5, Oct. 1987, pp. 657-662.

(Continued)

*Primary Examiner*—Pho M. Luu
(74) *Attorney, Agent, or Firm*—Hamilton, Brook, Smith & Reynolds, P.C.

(57) ABSTRACT

A circuit which accurately controls the word line (pass transistor gate) driving voltage to a voltage which is both controlled and is not significantly greater than is needed to drive the word line. The circuit eliminates the need for a double-boot-strapping circuit, and ensures that no voltages exceed that necessary to fully turn on a memory cell access transistor. Voltages in excess of that which would reduce reliability are avoided, and accurate driving voltages are obtained. A DRAM includes word lines, memory cells having enable inputs connected to the word lines, a gate receiving word line selecting signals at first logic levels $V_{ss}$ and $V_{dd}$, and for providing a select signal at levels $V_{ss}$ and $V_{dd}$, a high voltage supply source $V_{pp}$ which is higher in voltage than $V_{dd}$, a circuit for translating the select signals at levels $V_{ss}$ and $V_{dd}$ to levels $V_{ss}$ and $V_{pp}$ and for applying it directly to the word lines whereby an above $V_{dd}$ voltage level word line is achieved without the use of double boot-strap circuits.

43 Claims, 1 Drawing Sheet

U.S. PATENT DOCUMENTS

Figure 1:
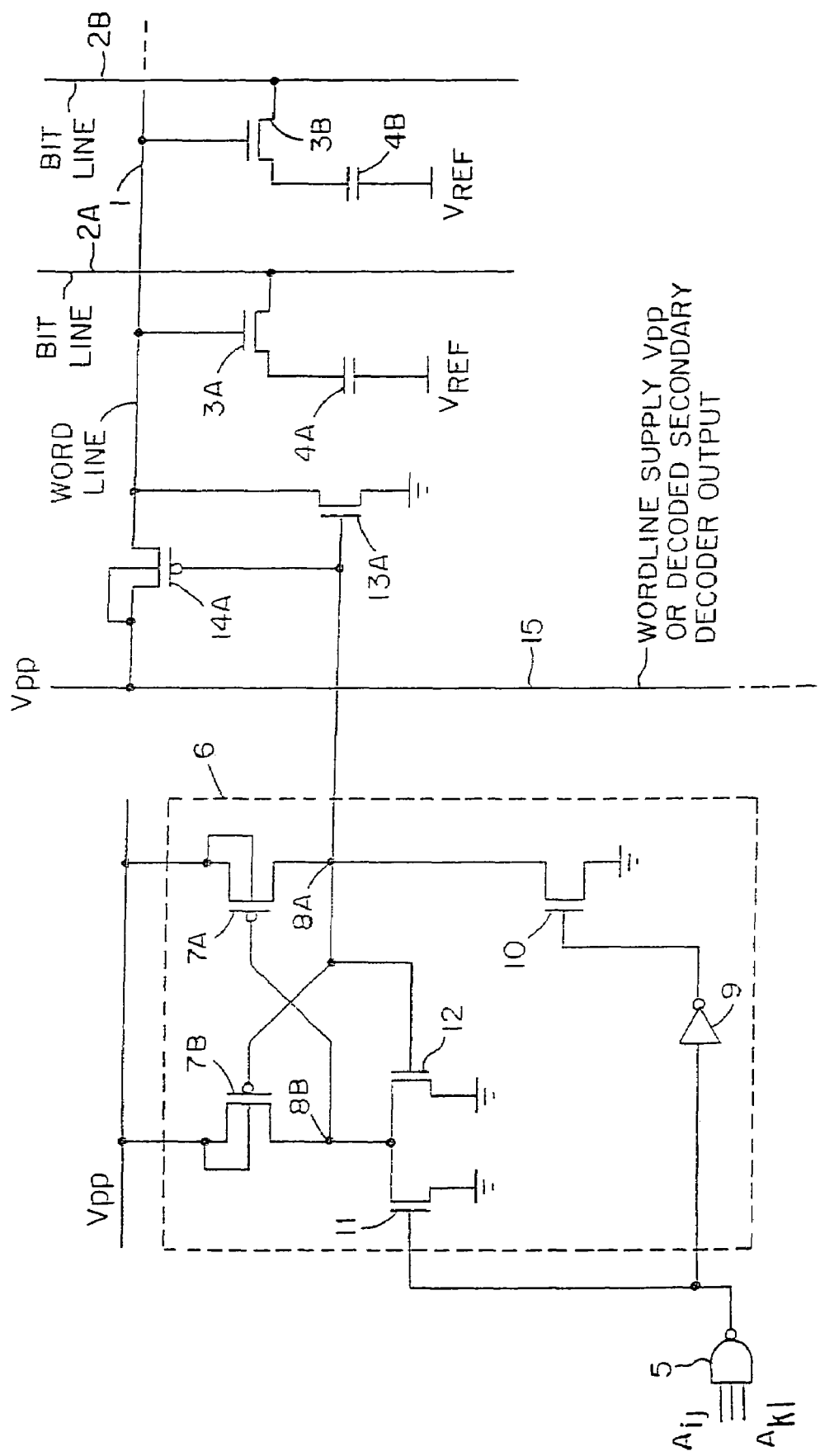

| | | | |
|---|---|---|---|
| 3,790,812 A | 2/1974 | Fry | |
| 3,801,831 A | 4/1974 | Dame | |
| 3,942,047 A | 3/1976 | Buchanan | |
| 3,980,899 A | 9/1976 | Shimada et al. | |
| 4,000,412 A | 12/1976 | Rosenthal et al. | |
| 4,001,606 A | 1/1977 | Dingwall | |
| 4,029,973 A | 6/1977 | Kobayashi et al. | |
| 4,037,114 A | 7/1977 | Stewart et al. | |
| 4,039,862 A | 8/1977 | Dingwall et al. | |
| 4,045,691 A | 8/1977 | Asano | |
| 4,047,091 A | 9/1977 | Hutchines et al. | |
| 4,061,929 A | 12/1977 | Asano | |
| 4,080,539 A | 3/1978 | Stewart | |
| 4,106,086 A | 8/1978 | Holbrook et al. | |
| 4,189,782 A | 2/1980 | Dingwall | |
| 4,199,806 A | 4/1980 | Patterson, III | |
| 4,208,595 A | 6/1980 | Gladstein | |
| 4,216,390 A | 8/1980 | Stewart | |
| 4,271,461 A | 6/1981 | Hoffmann et al. | |
| 4,279,010 A | 7/1981 | Morihisa | |
| 4,307,333 A | 12/1981 | Hargrove | |
| 4,330,852 A | 5/1982 | Redwine et al. | |
| 4,338,569 A | 7/1982 | Petrich | |
| 4,344,003 A | 8/1982 | Harmon et al. | |
| 4,344,005 A | 8/1982 | Stewart | |
| 4,403,158 A | 9/1983 | Slemmer | |
| 4,433,253 A | 2/1984 | Zapisek | |
| 4,442,481 A | 4/1984 | Brahmbhatt | |
| 4,471,290 A | 9/1984 | Yamaguchi | |
| 4,486,670 A | 12/1984 | Chan et al. | |
| 4,506,164 A | 3/1985 | Higuchi | |
| 4,511,811 A | 4/1985 | Gupta | |
| 4,527,258 A | 7/1985 | Guterman | |
| 4,533,843 A | 8/1985 | McAlexander, III et al. | |
| 4,543,500 A | 9/1985 | McAlexander et al. | |
| 4,581,546 A | 4/1986 | Allan | |
| 4,583,157 A | 4/1986 | Kirsch et al. | |
| 4,604,582 A | 8/1986 | Strenkowski et al. | |
| 4,612,462 A | 9/1986 | Asano et al. | |
| 4,616,303 A | 10/1986 | Mauthe | |
| 4,621,315 A | 11/1986 | Vaughn et al. | |
| 4,623,805 A | 11/1986 | Flora et al. | |
| 4,628,214 A | 12/1986 | Leuschner | |
| 4,636,930 A | 1/1987 | Bingham et al. | |
| 4,637,018 A | 1/1987 | Flora et al. | |
| 4,638,182 A | 1/1987 | McAdams | |
| 4,639,622 A | 1/1987 | Goodwin et al. | |
| 4,642,798 A | 2/1987 | Rao | |
| 4,656,373 A | 4/1987 | Plus | |
| 4,670,861 A | 6/1987 | Shu et al. | |
| 4,673,829 A | 6/1987 | Gupta | |
| 4,678,941 A | 7/1987 | Chao et al. | |
| 4,679,134 A | 7/1987 | Bingham et al. | |
| 4,689,504 A | 8/1987 | Raghunathan et al. | |
| 4,692,638 A | 9/1987 | Stiegler | |
| 4,697,252 A | 9/1987 | Furuyama et al. | |
| 4,716,313 A | 12/1987 | Hori et al. | |
| 4,730,132 A | 3/1988 | Watanabe et al. | |
| 4,733,108 A | 3/1988 | Truong | |
| 4,740,918 A | 4/1988 | Okajima et al. | |
| 4,751,679 A | 6/1988 | Dehganpour | |
| 4,782,247 A | 11/1988 | Yoshida | |
| 4,795,985 A | 1/1989 | Gailbreath, Jr. | |
| 4,798,977 A | 1/1989 | Sakui et al. | |
| 4,807,104 A | 2/1989 | Floyd et al. | |
| 4,807,190 A | 2/1989 | Ishii et al. | |
| 4,811,304 A | 3/1989 | Matsuda et al. | |
| 4,814,647 A | 3/1989 | Tran | |
| 4,820,941 A | 4/1989 | Dolby et al. | |
| 4,823,318 A | 4/1989 | D'Arrigo et al. | |
| 4,837,462 A | 6/1989 | Watanabe et al. | |
| 4,843,256 A | 6/1989 | Scade et al. | |
| 4,845,437 A | 7/1989 | Mansur et al. | |
| 4,857,763 A | 8/1989 | Sakurai et al. | |
| 4,873,673 A | 10/1989 | Hori et al. | |
| 4,878,201 A | 10/1989 | Nakaizumi | |
| 4,881,201 A | 11/1989 | Sato et al. | |
| 4,888,738 A | 12/1989 | Wong et al. | |
| 4,906,056 A | 3/1990 | Taniguchi | |
| 4,926,070 A | 5/1990 | Tanaka et al. | |
| 4,951,259 A | 8/1990 | Sato et al. | |
| 4,958,091 A | 9/1990 | Roberts | |
| 4,961,007 A | 10/1990 | Kumanoya et al. | |
| 4,982,317 A | 1/1991 | Mauthe | |
| 4,984,202 A | 1/1991 | Kawahara et al. | |
| 5,010,259 A | 4/1991 | Inoue et al. | |
| 5,018,107 A | 5/1991 | Yoshida | |
| 5,023,465 A | 6/1991 | Douglas et al. | |
| 5,031,149 A | 7/1991 | Matsumoto et al. | |
| 5,038,325 A | 8/1991 | Douglas et al. | |
| 5,038,327 A | 8/1991 | Akaogi | |
| 5,051,959 A | 9/1991 | Nakano et al. | |
| 5,059,815 A | 10/1991 | Bill et al. | |
| 5,086,238 A | 2/1992 | Watanabe et al. | |
| 5,101,117 A | 3/1992 | Johnson et al. | |
| 5,101,381 A | 3/1992 | Kouzi | |
| 5,103,113 A | 4/1992 | Inui et al. | |
| 5,109,394 A | 4/1992 | Hjerpe et al. | |
| 5,111,063 A | 5/1992 | Iwata | |
| 5,150,325 A | 9/1992 | Yanagisawa et al. | |
| 5,151,616 A | 9/1992 | Komuro | |
| 5,159,215 A | 10/1992 | Murotani | |
| 5,196,996 A | 3/1993 | Oh | |
| 5,197,033 A | 3/1993 | Watanabe et al. | |
| 5,208,776 A | 5/1993 | Nasu et al. | |
| 5,245,576 A | 9/1993 | Foss et al. | |
| 5,252,867 A | 10/1993 | Sorrells et al. | |
| 5,262,999 A | 11/1993 | Etoh et al. | |
| 5,264,743 A | 11/1993 | Nakagome et al. | |
| 5,272,390 A | 12/1993 | Watson, Jr. et al. | |
| 5,272,729 A | 12/1993 | Bechade et al. | |
| 5,276,646 A | 1/1994 | Kim et al. | |
| 5,295,164 A | 3/1994 | Yamamura | |
| 5,297,097 A | 3/1994 | Etoh et al. | |
| 5,307,315 A | 4/1994 | Oowaki et al. | |
| 5,311,476 A | 5/1994 | Kajimoto et al. | |
| 5,311,483 A | 5/1994 | Takasugi | |
| 5,317,202 A | 5/1994 | Waizman | |
| 5,319,755 A | 6/1994 | Farmwald et al. | |
| 5,323,354 A | 6/1994 | Matsumoto et al. | |
| 5,337,285 A | 8/1994 | Ware et al. | |
| 5,347,488 A | 9/1994 | Matsusbita | |
| 5,351,217 A | 9/1994 | Jeon | |
| 5,371,764 A | 12/1994 | Gillingham et al. | |
| 5,377,156 A | 12/1994 | Watanabe et al. | |
| 5,384,735 A | 1/1995 | Park et al. | |
| 5,406,523 A | 4/1995 | Foss et al. | |
| 5,412,615 A | 5/1995 | Noro et al. | |
| 5,414,381 A | 5/1995 | Nelson et al. | |
| 5,432,823 A | 7/1995 | Gasbarro et al. | |
| 5,440,514 A | 8/1995 | Flannagan et al. | |
| 5,463,337 A | 10/1995 | Leonowich | |
| 5,602,771 A | 2/1997 | Kajigaya et al. | |
| 5,657,481 A | 8/1997 | Farmwald et al. | |
| 5,699,313 A | 12/1997 | Foss et al. | |
| 5,751,643 A | 5/1998 | Lines | |
| 5,796,673 A | 8/1998 | Foss et al. | |
| 5,812,832 A | 9/1998 | Horne et al. | |
| 5,828,620 A | 10/1998 | Foss et al. | |
| 5,912,564 A | 6/1999 | Kai et al. | |
| 5,973,974 A | 10/1999 | Shirley | |
| 6,061,277 A * | 5/2000 | Lines ............... 365/189.11 |
| 6,067,272 A | 5/2000 | Foss et al. | |
| 6,205,083 B1 | 3/2001 | Foss et al. | |

| | | | |
|---|---|---|---|
| 6,236,581 B1 | 5/2001 | Foss et al. | |
| 6,256,248 B1 | 7/2001 | Leung | |
| 6,282,606 B1 | 8/2001 | Holland | |
| 6,314,052 B2 | 11/2001 | Foss et al. | |
| 6,446,021 B1 | 9/2002 | Schaeffer | |
| 6,449,685 B1 | 9/2002 | Leung | |
| 6,496,437 B2 | 12/2002 | Leung | |
| 6,580,654 B2 | 6/2003 | Foss et al. | |
| 6,614,705 B2 | 9/2003 | Foss et al. | |
| 6,657,918 B2 | 12/2003 | Foss et al. | |
| 6,657,919 B2 | 12/2003 | Foss et al. | |
| 6,847,573 B2 | 1/2005 | Lee et al. | |
| 6,898,130 B2 * | 5/2005 | Kajigaya et al. | 365/189.02 |
| 6,980,448 B2 | 12/2005 | Foss et al. | |
| 6,992,950 B2 | 1/2006 | Foss et al. | |
| 7,038,937 B2 | 5/2006 | Lines | |
| 2002/0067648 A1 | 6/2002 | Lee | |

FOREIGN PATENT DOCUMENTS

| | | |
|---|---|---|
| EP | 0197505 A2 | 10/1986 |
| EP | 0942430 A1 | 9/1999 |
| GB | 2184902 A | 7/1987 |
| GB | 2204456 A | 11/1988 |
| GB | 2 243 233 A | 10/1991 |
| JP | 53-90835 | 8/1978 |
| JP | 56-062066 | 5/1981 |
| JP | 56-62066 | 5/1981 |
| JP | 59-213090 | 12/1984 |
| JP | 61030846 | 2/1986 |
| JP | 62-21323 | 1/1987 |
| JP | 62020200 | 1/1987 |
| JP | 62021323 | 1/1987 |
| JP | 62-73638 | 5/1987 |
| JP | 62-178013 | 8/1987 |
| JP | 62-189816 | 8/1987 |
| JP | 62178013 | 8/1987 |
| JP | 62-73638 | 12/1987 |
| JP | 63-239673 | 10/1988 |
| JP | 63-292488 | 11/1988 |
| JP | 1185160 | 7/1989 |
| JP | 3-23590 | 1/1991 |
| JP | 3058379 | 3/1991 |
| JP | 03-086995 | 4/1991 |
| TW | 434545 | 5/2001 |
| TW | 466490 | 12/2001 |
| TW | 476960 | 2/2002 |
| WO | WO 86/04724 A1 | 8/1986 |
| WO | WO 00/25317 | 5/2000 |

OTHER PUBLICATIONS

Ishihara, et al., "256k CMOS Dynamic RAM With Static Column Mode of Cycle Time of 50 ns," Nikkei Electronics, Feb. 11, 1985, pp. 243-263.
Kitsukawa, Goro, et al., "A 1-Mbit BiCMOS DRAM Using Temperature-Compensation Circuit Techniques," *IEEE Journal of Solid-State Circuits*, V. 24, No. 3, Jun. 1989, pp. 597-601.
Kitsukawa, Goro, et al., "A 23-ns 1-Mb BiCMOS DRAM," *IEEE Journal of Solid-State Circuits*, V. 25, No. 5, Oct. 1990, pp. 1102-1111.
Nakagome, Yoshinobu, et al, "An Experimental 1.5-V 64-Mb DRAM," *IEEE Journal of Solid-State Circuits*, V. 26, No. 4, Apr. 1991, pp. 465-472.
Fujii, Syuso, et al., "A 45-ns 16-Mbit DRAM with Triple-Well Structure," *IEEE Journal of Solid-State Circuits*, V. 24, No. 5, Oct. 1989, pp. 1170-1174.
Gillingham, Peter, et al., "High-Speed, High-Reliability Circuit Design for Megabit DRAM," *IEEE Journal of Solid-State Circuits*, V. 26, No. 8, Aug. 1991, pp. 1171-1175.

Fujii, S., et al., "A 45ns 16Mb DRAM with Triple-Well Structure," *1989 IEEE International Solid-State Circuits Conference (ISSCC 89)*, Session 16: Dynamic RAMs, FAM 16.6, pp. 248-249, Feb. 1989.
Lu, N.C.C., et al., "A 20-ns 128-kbit x 4 High-Speed DRAM with 330-Mbit/s Data Rate", *IEEE Journal of Solid-State Circuits*, V. 23, No. 5, pp. 1140-1149, Oct. 1988.
Lu, N.C.C., et al., "A 20ns 512Kb DRAM with 83MHz Page Operation" *1989 IEEE International Solid-State Circuits Conference (ISSCC 88)*, Session XVI: Dynamic Memory, FAM 16.3, Feb. 1988.
IBM Technical Disclosure Bulletin, "High Performance Complementary Decoder/Driver Circuit," V. 29, No. 6, Nov. 1986, pp. 2390-2394.
IBM Technical Disclosure Bulletin, "Improved Decoder Circuits for CMOS Memory Arrays," V. 30, No. 2, Jul. 1987, pp. 664-666.
"An Analysis of Toshiba TC511000/TC511001 CMOS 1Mx1 DRAMs," (Author Unknown), MOSAID Inc., pp. 29-36, 145-159, Aug. 1986.
Bursky, D., "Memory ICs," *Electronic Design*, V. 36, No. 4, pp. 71-81, Feb. 1988.
Kitsukawa, G., et al., "A 1-M BiCMOS DRAM Using Temperature- Compensation Circuit Technique," *IEEE Journal of Solid-State Circuits*, V. 24, No. 3, pp. 597-601, Jun. 1989.
Watanabe, T., et al., "Comparison of CMOS and BiCMOS 1-Mbit DRAM Performance," *IEEE Journal of Solid-State Circuits*, V. 24, No. 3, pp. 771-778, Jun. 1989.
Nakagome, Y., et al., "An Experimental 1.5-V 64-Mb DRAM," *IEEE Journal of Solid-State Circuits*, V. 26, No. 4, pp. 465-472, Apr. 1991.
Nakagome, Y., et al., "A 1.5V Circuit Technology for 64Mb DRAMs," *1990 Symposium on VLSI Circuits*, Honolulu, Hawaii, pp. 17-18, Jun. 1990.
Bursky, D., "Digital Technology," *Electronic Design*, V. 40, No. 4, pp. 48-61, Feb. 1992.
Schematics of Micron 1M×4 DRAM MT4C4001DJ-8.
Aoki, Masakazu, et al., "A 1.5V DRAM for Battery-Based Applications," *IEEE Journal of Solid-State Circuits*, V. 24, No. 5, Oct. 1989, pp. 1206-1212.
Aoki, Masakazu, et al., "New DRAM Noise Generation Under Half-$V_{CC}$ Precharge and its Reduction Using a Transposed Amplifier," *IEEE Journal of Solid-State Circuits*, V. 24, No. 4, Aug. 1989, pp. 889-894.
Arimoto, Kazutami, et al., "A 60-ns 3.3-V-Only 16-Mbit DRAM with Multipurpose Register," *IEEE Journal of Solid-State Circuits*, V. 24, No. 5, Oct. 1989, pp. 1184-1189.
Arimoto, Kazutami, et al., "A Speed-Enhanced DRAM Array Architecture with Embedded ECC," *IEEE Journal of Solid-State Circuits*, V. 25, No. 1, Feb. 1990, pp. 11-17.
Asakura, Mikio, et al., "An Experimental 1-Mbit Cache DRAM with ECC," *IEEE Journal of Solid-State Circuits*, V. 25, No. 1, Feb. 1990, pp. 5-10.
Eldin, A.G., et al., "New Dynamic Logic and Memory Circuit Structures for BICMOS Technologies," *IEEE Journal of Solid-State Circuits*, V. SC-22, No. 3, Jun. 1987, pp. 450-453.
Fujii, Syuso, et al., "A 50-µA Standby 1Mx1/256Kx4 CMOS DRAM with High-Speed Sense Amplifier," *IEEE Journal of Solid-State Circuits*, V. SC-21, No. 5, Oct. 1986, pp. 643-648.
Furuyama, Tohru, et al., "An Experimental 4-Mbit CMOS DRAM," *IEEE Journal of Solid-State Circuits*, V. SC-21, No. 5, Oct. 1986, pp. 605-611.
Hori, Ryoichi, et al., "An Experimental 1 Mbit DRAM Based on High *S/N* Design," *IEEE Journal of Solid-State Circuits*, V. SC-19, No. 5, Oct. 1984, pp. 634-640.

Gray, Paul R., et al., "MOS Operational Amplifier Design—A Tutorial Overview," *IEEE Journal of Solid-State Circuits*, V. SC-17, No. 6, Dec. 1982, pp. 969-982.

Horiguchi, Masashi, et al., "A Tunable CMOS-DRAM Voltage Limiter with Stabilized Feedback Amplifier," *IEEE Journal of Solid-State Circuits*, V. 25, No. 5, Oct. 1990, pp. 1129-1135.

Itoh, Kiyoo, "Trends in Megabit DRAM Circuit Design," *IEEE Journal of Solid-State Circuits*, V. 25, No. 3, Jun. 1990, pp. 778-789.

Kimura, Katsutaka, et al., "A 65-ns 4-Mbit CMOS DRAM with a Twisted Driveline Sense Amplifier," *IEEE Journal of Solid-State Circuits*, V. SC-22, No. 5, Oct. 1987, pp. 651-656.

Masuoka, Fujio, et al., "A 256-kbit Flash $E^2$ PROM Using Triple-Polysilicon Technology," *IEEE Journal of Solid-State Circuits*, V. SC-22, No. 4, Aug. 1987, pp. 548-552.

Miyamoto, Jun-Ichi, et al., "An Experimental 5-V-Only 256-kbit CMOS EEPROM with a High-Performance Single-Polysilicon Cell," *IEEE Journal of Solid-State Circuits*, V. SC-21, No. 5, Oct. 1986, pp. 852-861.

Momodomi, Masaki, et al., "An Experimental 4-Mbit CMOS EEPROM with a NAND-Structured Cell," *IEEE Journal of Solid-State Circuits*, V. 24, No. 5, Oct. 1989, pp. 1238-1243.

Nakagome, Yoshinobu, et al., "Circuit Techniques for 1.5—3.6-V Battery-Operated 64-Mb DRAM," *IEEE Journal of Solid-State Circuits*, V. 25, No. 7, Jul. 1991, pp. 1003-1010.

Ohta, Kiyoto, et al., "A 1-Mbit DRAM with 33-MHz Serial I/O Ports," *IEEE Journal of Solid-State Circuits*, V. SC-21, No. 5, Oct. 1986, pp. 649-654.

Saito, Shozo, et al., "A 1-Mbit CMOS DRAM with Fast Page Mode and Static Column Mode," *IEEE Journal of Solid-State Circuits*, V. SC-20, No. 5, Oct. 1985, pp. 903-908.

Samachisa, Gheorghe, et al., "A 128K Flash EEPROM Using Double-Polysilicon Technology,"*IEEE Journal of Solid-State Circuits*, V. SC-22, No. 5, Oct. 1987, pp. 676-683.

Scheuerlein, Roy E., et al., "Shared Word Line DRAM Cell," *IEEE Journal of Solid-State Circuits*, V. SC-19, No. 5, Oct. 1984, pp. 640-645.

Takada, Masahide, et al., "A 4-Mbit DRAM with Half-Internal-Voltae Bit-Line Precharge," *IEEE Journal of Solid-State Circuits*, V. SC-21, No. 5, Oct. 1986, pp. 612-617.

Takeshima, Toshio, et al., "Voltage Limiters for DRAM's with Substrate-Plate-Electrode Memory Cells," *IEEE Journal of Solid-State Circuits*, V. 23, No. 1, Feb. 1988, pp. 48-52.

Witters, Johan S., et al., "Analysis and Modeling of On-Chip High-Voltage Generator Circuits for Use in EEPROM Circuits," *IEEE Journal of Solid-State Circuits*, V. 24, No. 5, Oct. 1989, pp. 1372-1380.

Horiguchi, Masashi, et al., "Dual-Operating-Voltage Scheme for a Single 5-V 16-Mbit DRAM," *IEEE Journal of Solid-State Circuits*, V. 23, No. 5, Oct. 1988, pp. 1128-1133.

Scheuerlein, Roy E., et al., "Offset Word-Line Architecture for Scaling DRAM's to the Gigabit Level," *IEEE Journal of Solid-State Circuits*, V. 23, No. 1, Feb. 1988, pp. 41-47.

Gray, Paul R., et al., *Analog MOS Integrated Circuits, II*, IEEE Press, 1988, pp. iv-vii, 22-23.

Elmasry, Mohamed, editor. *Digital MOS Integrated Circuits II with Applications to Processors and Memory Design*, IEEE Press, 1992.

Wang, Niantsu, *Digital MOS Integrated Circuits—Design for Applications*, Prentice Hall, 1990, pp. 240-245.

Texas Instruments, Memory Products Development, "16Mbit DRAM Crib Notes," Jul. 1990, pp. 12-13.

Martin, Ken, et al., "Effects of the Op Amp Finite Gain and Bandwidth on the Performance of Switched-Capacitor Filters," *IEEE Transactions on Circuits and Systems*, V. CAS-28, No. 8, Aug. 1981, pp. 134-141.

Johns, David A., et al., *Analog Integrated Circuit Design*, John Wiley & Sons, Inc., 1997, pp. 408, 410-411, 442-443.

Keeth, Brent, et al., *DRAM Circuit Design*, Chapter 2, "The DRAM Array," John Wiley & Sons, Inc., 2000, pp. 35-68.

Reverse Engineering report—"An Analysis of the Toshiba TC511000/TC511001 CMOS 1Mx1 DRAMs," MOSAID, Aug. 1986.

Reverse Engineering full report—"An Analysis of the Toshiba TC511000/TC511001 CMOS 1Mx1 DRAMs," MOSAID, Aug. 1986.

Reverse Engineering report—Samsung KM44C4100BS-7, 6 pgs.

Reverse Engineering report—"A Design Analysis of the TMS4164," MOSAID, Aug. 1987.

Reverse Engineering report—"An Analysis of the i2164A," MOSAID, Apr. 1982.

Reverse Engineering report—Samsung KM44S64230At-GL.

Cenker, Ronald P., et al. "A Fault-Tolerant 64K Dynamic RAM," 1979 *IEEE International Solid-State Circuits Conference*, (ISSCC 79), Session XII: Dynamic Memories, pp. 150-151 and 290, (Feb. 1979).

Hoffman, William K., et al., "An 8Kb Random-Access Memory Chip Using the One-Device FET Cell," *IEEE Journal of Solid-State Circuits*, V. SC-8, No. 5, Oct. 1973, pp. 298-305.

Komatsuzaki, K., et al., "Circuit Techniques for a Wide Word I/O Path 64 Meg DRAM," *1991 IEEE Symposium on VSLI Circuits*, Session 14: Dynamic RAM II, May 30-Jun. 1, 1991, pp. 133-134.

Weste, Neil H. E., et al., "Principles of CMOS VLSI Design," *Addison-Wesley Publishing Company*, p. 13 (1998).

Summary Judgement Opinion, United States District Court for the District of New Jersey (Samsung and Infineon), Apr. 1, 2005.

Summary Judgement Order, United States District Court for the District of New Jersey (Samsung and Infineon), Apr. 1, 2005.

MOSAID's Brief in Support of its Motions for Summary Judgment Against Samsung and Infineon, Nov. 12, 2004.

MOSAID's Local Rule 56.1 Statement of Undisputed Facts (Samsung and Infineon), Nov. 12, 2004.

Infineon Technologies North America Corp. et al.'s Memorandum in Opposition to MOSAID's Motions for Summary Judgment Against Infineon, Nov. 22, 2004.

Infineon Technologies North America Corp. et al.'s Local Rule 56.1 Statement of Material Facts in Opposition to MOSAID's Motions for Summary Judgment.

MOSAID's Reply Brief in Further Support of its Motion for Summary Judgment Against Infineon as to Non-Infringement and Affirmative Defenses of Invalidity and Unenforceability Against Samsung and Infineon, Nov. 29, 2004.

Jan. 12, 1990 Fast 1Mbit Mentor Schematics.

Jan. 29, 1990 fax.

Feb. 9, 1990 OEM Agreement in Principle.

Feb. 9, 1990 Fax from MOSAID to Sanyo.

Feb. 19, 1990 Design License Agreement.

Feb. 19, 1990 Fax from MOSAID to Sanyo.

Feb. 21, 1990 Fax from MOSAID to Sanyo.

Sep. 7, 1990 Letter from Sanyo to MOSAID.

May 20, 1992 MOSAID Purchase Order.

Jul. 9, 1996 Sanyo-MOSAID Meeting. Agenda.
Apr. 17, 2003 Gillingham Deposition.
May 13, 2003 Foss Deposition.
Jun. 18, 2003 Goto Deposition.
May 20, 2004 Foss Deposition.
May 28, 2004 Scott Deposition.
Anceau, "Synchronous Approach for Clocking VLSI Systems," IEEE Journal of Solid-State Circuits, vol. SC-17, No. 1, pp. 51-56 (Feb. 1982).
Atsumi, Shigeru, et al., "Fast Programmable 256K Read-Only Memory with On-Chip Test Circuits," IEEE International Solid State Circuits (Feb. 1985).
Atsumi, Shigeru, et al., "A 16ns 1 Mb CMOS EPROM," IEEE International Solid States Circuits Conference (Feb. 14, 1990).
Chen, "Designing On-Chip Clock Generators," Circuits and Devices, pp. 32-36 (Jul. 1992).
Efendovich, Avner, et al., "Multifrequency Zero-Jitter Delay-Locked Loop," IEEE Journal of Solid-State Circuits, vol. 29, No. 1, pp. 67-70 (Jan. 1994).
Gasbarro, "Testing High Speed DRAMS," International Test Conference, Paper 13.2, p. 361 (Oct. 1994) (FIN 030541).
Gasbarro, et al., "Techniques for Characterizing DRAMS With a 500 MHz Interface," International Test Conference, Paper 22.2, pp. 516-525 (Oct. 1994) (FIN 030542-551).
Horowitz, M., et al., "PLL Design for a 500 MB/s Interface," ISSCC, Digest of Technical Papers, Session 10: High Speed Communication and Interfaces, Paper TP 10.5, pp. 160-161 (Feb. 1993).
IBM Technical Disclosure Bulletin, "Positive Level-Shifting Wordline Drivers for DRAMS," vol. 33, No. 2, pp. 187-189 (Jul. 1990).
Jeung, Yeun C., "50Mbit/sec. CMOS Video Linestore System," SPIE vol. 1001 Visual Communications and Image Processing, pp. 362-367 (Nov. 1988).
Johnson, et al., "A Variable Delay Line PLL for CPU-Coprocessor Synchronization," IEEE Journal of Solid-State Circuits, vol. 23, No. 5, pp. 1218-1223 (Oct. 1988) (MTX 010690-95).
Kushiyama, Natsuki, et al., "A 500-Megabyte/s Data-Rate 4.5M DRAM," IEEE Journal of Solid-State Circuits, vol. 28, No. 4, pp. 490-498 (Apr. 1993). (FIN 024863-71).
Lee, Thomas H., et al., "A 2.5V Delay-Locked Loop for an 18Mb 500MB/s DRAM," IEEE International Solid State Circuits Conference, Session 18: High Performance Logic and Circuit Techniques, Paper FA 18.6, pp. 300-301 (Feb. 18, 1994) (FIN 30552-031143).
Menasce, et al., "A Fully Digital Phase Locked Loop," Canadian Conference on VLSI, pp. 9.4.1-9.4.8 (Oct. 1990) (FIN 029869-876).
NEC, PLL Enable Mode, JC-42.3 (Sep. 13, 1994) (FIN 23323, 23326, 23329).
Przybylski, Steven, "New DRAM Technologies" MicroDesign Resources, Sebastopol, CA (1994) (FIN 030552-031143).
Rambus Product Catalog, 1993 (000089-98).
Rambus RDRAM Reference Manual, 1993 (RM0000117-122).
Schanke, "Proposal for Clock Distribution in SCI," May 5, 1989 (FIN 30526-530).
Sidiropoulos, et al., "A CMOS 500 Mbps/pin synchronous point to point link interface," Symposium on VLSI Circuits, Digest of Technical Papers, pp. 43-44 (Jun. 1994) (FIN 030531-32).
Tanaka, S. et al., "A Programmable 256K CMOS EPROM with On-Chip Test Circuits," International Solid-State Circuits Conference (ISSCC 84), Session X: Nonvolatile Memories, THAM 10.7, pp. 148-149 (Feb. 1984).
U.S. Patent Application for Delay Locked Loop (DLL) Implementation in a Synchronous Dynamic Random Access Memory (SDRAM), MOSAID Technologies Incorporated, Semiconductor Division (Sep. 29, 1994) (MTI 118756-768).
Wagner, et al., "Testable Programmable Digital Clock Pulse Control Elements," International Test Conference at 902, 1993 (FIN 030533-540).
MOSAID's Complaint [against Samsung], filed in 01-04340, on Sep. 13, 2001.
Defendants' Amended Objections and Responses to MOSAID's First Set of Interrogatories, served in 01-04340, on Jun. 13, 2002.
Defendants' First Supplemental Responses to MOSAID's Second Set of Interrogatories, served in 01-04340, on Feb. 6, 2003.
Defendants' Objections and Responses to MOSAID's Third Set of Interrogatories, served in 01-04340 (D. NJ), on Feb. 6, 2003.
MOSAID's Second Amended Complaint filed in consolidated NJ action, C. A. No. 01-4340, on Oct. 14, 2003.
MOSAID's Second Amended Complaint filed in consolidated NJ action, C. A. No. 01-4340, on Oct. 28, 2003.
Infineon's Reply and Answer to MOSAID's Third Amended Counterclaims and Related Counter Counterclaims, filed in consolidated NJ action, C. A. No. 03-04698, on Oct. 29, 2003.
Opinion re. Claim Construction, entered in 01-04340 and 03-04698, on Mar. 22, 2004.
Order re. Claim Construction, entered in 01-04340 and 03-04698, on Mar. 22, 2004.
Stipulated Order Dismissing Claims Without Prejudice, filed in 03-04698, on May 25, 2004 (as to claims related to U.S. Patent No. 6,067,272, only).
Opinion re. MOSAID's Motion for Reconsideration of Claim Construction rulings—Denied, entered in 01-04340 and 03-04698, on Jun. 14, 2004.
Order Denying MOSAID's Motion for Reconsideration of Claim Construction rulings, entered in 01-04340 and 03-04698, on Jun. 14, 2004.
Preliminary Expert Report of Joseph C. McAlexander Regarding Invalidity of MOSAID Patents, served in 03-04698, on Oct. 15, 2004.
Supplemental Expert Report of Joseph C. McAlexander Regarding Invalidity of MOSAID Patents, served in 03-04698, on Oct. 28, 2004.
Order of Dismissal, entered in 01-04340, on Jan. 31, 2005.
Infineon's Complaint for Declaratory Judgment, filed in 02-05772, on Dec. 11, 2002.
Defendant MOSAID Technologies Incorporated's Amended Answer and Counterclaims, filed in 02-05772, on May 30, 2003.
Defendant MOSAID Technologies Incorporated's Third Amended Answer and Counterclaims, filed in 01-04340 (D. NJ), consolidated with 02-05772 (N.D. CA), on Jul. 14, 2005.
Stipulated Motion for Dismissal With Prejudice, filed in 02-05772, on Mar. 2, 2007.
Order Dismissing All Remaining Claims and Counterclaims Pursuant to Parties' Stipulation, entered in 02-05772, on Mar. 7, 2007.
Judgment (dismissing action and closing file), entered in 02-05772, on Mar. 7, 2007.

Complaint for Declaratory Judgment and Demand for Jury Trial against MOSAID Technologies Incorporated, filed in 06-04496 (N. D. CA), on Jul. 24, 2006.

Order Granting MOSAID's Motion to Dismiss for Lack of Subject Matter Jurisdiction, entered in 06-04496, on Oct. 23, 2006.

Complaint for Patent Infringement, filed by MOSAID Technologies, Inc., in 06-00302 (E. D. TX), on Jul. 25, 2006.

First Amended Complaint for Patent Infringement, filed by MOSAID Technologies, Inc., in 06-00302, on Aug. 31, 2006.

Second Amended Complaint for Patent Infringement, filed by MOSAID Technologies, Inc., in 06-00302, on Dec. 15, 2006.

Defendant Micron Technology, Inc.'s Answer to Second Amended Complaint and Counterclaims, filed in 06-00302, on Jan. 31, 2007.

Defendant ProMOS's Answer, Affirmative Defenses, and Counterclaims to MOSAID's Second Amended Complaint, filed in 06-00302, on Feb. 6, 2007.

Defendant Powerchip's Answer, Defenses, and Counterclaims to MOSAID's Second Amended Complaint, filed in 06-00302, on Feb. 7, 2007.

Defendant Powerchip's Amended Answer, Defenses, and Counterclaims to MOSAID's Second Amended Complaint, filed in 06-00302, on Feb. 22, 2007.

Plaintiff MOSAID Technologies, Inc.'s Reply to Counter-Plaintiff ProMOS Technologies' Counterclaims, filed in 06-00302, on Mar. 12, 2007.

Plaintiff MOSAID Technologies, Inc.'s Reply to Counter-Plaintiff Powerchip Semiconductor Corp.'s Amended Counterclaims, filed in 06-00302, on Mar. 12, 2007.

Plaintiff MOSAID Technologies, Inc.'s Reply to Counter-Plaintiff Micron Technology, Inc.'s Counterclaims, filed in 06-00302, on Mar. 23, 2007.

Defendant Mosel Vitelic, Inc.'s Answer, Affirmative Defenses and Counterclaims to MOSAID's Second Amended Complaint, filed in 06-00302, on Mar. 30, 2007.

Defendant ProMOS's Amended Answer, Affirmative Defenses, and Counterclaims to MOSAID's Second Amended Complaint, filed in 06-00302, on Apr. 10, 2007.

Plaintiff MOSAID Technologies, Inc.'s Reply to Counter-Plaintiff Mosel Vitelic, Inc.'s Counterclaims, filed in 06-00302, on Apr. 23, 2007.

Plaintiff MOSAID Technologies, Inc.'s Reply to Counter-Plaintiff ProMOS Technologies' Amended Counterclaims, filed in 06-00302, on Apr. 27, 2007.

Order Granting Micron Technology, Inc.'s Amended Motion to Dismiss its Counterclaim for Infringement of U.S. Patent No. 6,446,021, entered in 06-00302, on Jul. 10, 2007.

Notice of Service [of Defendant Powerchip's Invalidity Contentions], filed in 06-00302, on Aug. 13, 2007.

Notice of Service [of Defendant ProMOS Technologies, Inc.'s Invalidity Contentions], filed in 06-00302, on Aug. 13, 2007.

Notice of Service [of Defendant Mosel Vitelic, Inc.'s Preliminary Invalidity Contentions], filed in 06-00302, on Aug. 13, 2007.

Defendant Micron Technology, Inc.'s Notice of Compliance with P.R. 3-3 and 3-4, filed in 06-00302, on Aug. 14, 2007.

Plaintiff MOSAID Technologies, Inc.'s Sep. 5, 2007 Identification of Patent Claims, filed in 06-00302, on Sep. 5, 2007.

Choi, Yunho, et al., "16-Mb Synchronous DRAM with 125-Mbyte/s Data Rate," IEEE Journal of Solid-State Circuits, vol. 29, No. 4, pp. 529-533 (Apr. 1994).

Choi, Yunho, et al., "16Mbit Synchronous DRAM with 125Mbyte/sec Data Rate," 1993 Symposium on VLSI Circuits, Digest of Technical Papers, pp. 65-66, (1993).

Takai, Y., et al., "250 Mbyte/sec Synchronous DRAM Using a 3-Stage-Pipelined Architecture," 1993 Symposium on VLSI Circuits, Digest of Technical Papers, pp. 59-60 (1993).

Takai, Yasuhiro, et al., "250 Mbyte/s Synchronous DRAM Using a 3-Stage-Pipelined Architecture," IEEE Journal of Solid-State Circuits, vol. 29, No. 4, pp. 426-431 (Apr. 1994).

Komatsuzaki, K., et al., "Circuit Techniques for A Wide Word I/O Path 64 Meg DRAM," 1991 Symposium on VLSI Circuits, Digest of Technical Papers, pp. 133-134, (May 30 - Jun. 1, 1991).

"Lines '703 Prior Art," MOSAID00050393. Apr. 6, 1990.

Pribyl, W., et al., "New Concepts for Wordline Driving Circuits in CMOS Dynamic Random Access Memories," Fourteenth European Solid-State Circuites Conference UMIST, Manchester UK, Sep. 21-23, 1988, IBM 000226-000231.

Excerpts from Micron Technology, Inc. 1995 Memory Product Guide. (MC019763 - MC019767).

Asakura, Mikio, et al., "Cell-Plate Line Connecting Complementary Bitline ($C^3$) Architecture for Battery Operating DRAMs," Digest of Technical Papers, Session 7-2, 1991 Symposium on VLSI Circuits, May 30 - Jun. 1, 1991, pp. 59-60.

Blalock, Travis, et al., "A High Speed Clamped-Bit-Line Sensing Scheme for IT Dynamic RAMs," Digest of Technical Papers, Session 7-3, 1991 Symposium on VLSI Circuits, May 30 - Jun. 1, 1991, pp. 61-62.

Bonges, H.A., III, et al., "A 576k 3.5-ns Access BiCMOS ECL Statis Ram with Array Built-In Self Test," Digest of Technical Papers, Session 2-2, 1991 Symposium on VSLI Circuits, May 30 - Jun. 1, 1991, pp. 13-14.

Fukumoto, Katsumi, et al., "A 256K-Bit Non-Volatile PSRAM with Page Recall and Chip Store," Digest of Technical Papers, Session 10-1, 1991 Symposium on VSLI Circuits, May 30 - Jun. 1, 1991, pp. 91-92.

Hidaka, Hideto, et al, "A High-Density Dual-Port Memory Cell Operation for ULSI DRAMs," Digest of Technical Papers, Session 7-5, 1991 Symposium on VSLI Circuits, May 30 - Jun. 1, 1991 pp. 65-66.

Hitachi America, Ltd., "Pseudo Static RAM (HM658512 Series) Integrated Circuits Application Note," pp. 1-18 and 20 (1990). (MC011747 - MC011768).

Horiguchi, M., et al., "Dual-Regulator Dual-Decoding-Trimmer DRAM Voltage Limiter for Burn-In," Digest of Technical Papers, Session 14-2, 1991 Symposium on VLSI Circuits, May 30 - Jun. 1, 1991, pp. 127-128.

Integrated Device Technology, Inc., 1991 Static RAM Data Book (1991). (MC019809 - MC019822).

Ishibashi, Kochiro, et al., "A 1.7V Adjustable I/O Interface for Low Voltage Fast SRAMs," Digest of Technical Papers, Session 10-4, 1991 Symposium on VLSI Circuits, May 30 - Jun. 1, 1991, pp. 97-98.

JEDEC Standard, Double Data Rate (DDR) SDRAM Specification, JESD79 (Jun. 2000). (MC019823 - MC019899).

JEDEC Standard No. 21-C (2000): Sec. e.g, §§ 3.11.5. (MC021573 - MC021727).

Jones, et al., "A New Era of Fast Dynamic RAMS," IEEE Spectrum, October 1992. (MC021305 - MC021309).

Kato, H., et al., "Consideration of poly-Si loaded cell capacity limits for each of low-power and high-speed SRAM's," Digest of Technical Papers, Session 10-2, 1991 Symposium on VLSI Circuits, May 30 - Jun. 1, 1991, pp. 93-94.

Kawahara, T., et al., "A Circuit Technology for Sub-10ns ECL 4Mb BiCMOS," Digest of Technical Papers, Session 14-4, 1991 Symposium on VLSI Circuits, May 30 - Jun. 1, 1991, pp. 131-132.

Kirihata, T., et al., "A Pulsed Sensing Scheme with a Limited Bit-Line Swing," Digest of Technical Papers, Session 7-4, 1991 Symposium on VLSI Circuits, May 30 - June 1, 1991, pp. 63-64.

Komatsuzaki, K., et al., "Circuit Techniques for a Wide Word I/O Path 64 Meg DRAM," Digest of Technical Papers, Session 14-5, 1991 Symposium on VLSI Circuits, May 30 - Jun. 1, 1991, pp. 133-134.

Kung, Roger I., et al., "An 8K x 8 Dynamic RAM with Self-Refresh," IEEE Journal of Solid-state Circuits, vol. SC-17, No. 5, at pp. 863-871, (Oct 1982). (MC011769 - MC011777).

Kuroda, Tadahiro, et al., "Automated Bias Control (ABC) Circuit for High-Performance VLSIs," Digest of Technical Papers, Session 2-3, 1991 Symposium on VLSI Circuits, May 30 - Jun. 1, 1991. pp. 15-16.

Lee, Thomas H., et al., FA18.6: "A 2.5V Delay-Locked Loop for an 18Mb 500MB/s DRAM," 1991 IEEE International Solid State Circuits Conference, p. 300.

Memory Data Book, "Pseudo-Static RAMS" pp. 2-1 through 2-50, 1993 Sharp Electronics Corp., P.O. Box 19086, Portland, OR 97280. (MC021157 - MC021206).

Micron Technology, Inc., Advance Data Sheet, "MT48LC4M4R1 (S) 4 Meg X 4 Meg SDRAM" (1994) (MC020053 - MC020094).

Micron Technology, Inc., Advance Data Sheet, "Synchronous Graphics RAM, 256K x 32 SGRAM, MT41LC256K32D4(S)" 1995 DRAM Data Book (MC019915 - MC019953).

Min, Dong-Sun, et al., "Temperature-Compensation Circuit Techniques for High-Density CMOS DRAMs," Digest of Technical Papers, Session 14-1, 1991 Symposium on VLSI Circuits, May 30 - Jun. 1, 1991, pp. 125-126.

Motorola, Inc., "32K x 9 Bit BurstRAM[198] Synchronous Static RAM," Fast Static RAM BiCMOS, CMOS, and Module Data, at pp. 4-67 to 4-100, (1993). (MC011778 - MC011802).

Nambu, Hiroaki, et al., "A 1.5ns, 64Kb EDL-CMOS SRAM," Digest of Technical Papers, Session 2-1, 1991 Symposium on VLSI Circuits, May 30 - Jun. 1, 1991, pp. 11-12.

Nogami, Kazutaka, et al., "1-MBit Virtually Static RAM," IEEE Journal of Solid-State Circuits, vol. SC-21, No. 5, at pp. 662-669, (Oct. 1986). (MC011803 - MC011810).

Press Release, "Toshiba Announces Industry's First 64MB Pseudo SRAM Family." (Sep. 20, 2001). (MC019967 - MC013368).

Press Release, "Toshiba Announces the World's First 64-Megabit Pseudo SRAMs," (Sep. 20, 2001). (MC020107 - MC020108).

Prince, Betty, "Semiconductor Memories: A Handbook of Design, Manufacture, and Application," 2nd Edition; John Wiley & Sons, New York, (Reprinted Jun. 1997). (MC011811 - MC011839).

Samsung Electronics 2001 Annual Report at pp. 6 and 7. (MC019969 - MC020039).

Sawada, Kazuhiro, et al., "A 30-µA Data-Retention Pseudostatic RAM with Virtually Static RAM Mode," IEEE Journal of Solid-State Circuits, vol. 23, No. 1, at pp. 12-19, (Feb. 1988). (MC011843 - MC011850).

Takao, Y., et al., "A Low-Power SRAM Utilizing High ON/OFF Ratio Laser-Recrystallized SOI PMOSFET," Digest of Technical Papers, Session 10-3, 1991 Symposium on VLSI Circuits, May 30 - Jun. 1, 1991, pp. 95-96.

Takashima, Daisaburo, et al., "Word-Line Architecture for Constant Reliabilty 64Mb DRAM," Digest of Technical Papers, Session 7-1, 1991 Symposium on VLSI Circuits, May 30 - Jun. 1, 1991, pp. 57-58.

Tamaki, Satoshi, et al., "14µA Data Retention DRAM with Intermittent Bit-Line Balancing Scheme," Digest of Technical Papers, Session 14-3, 1991 Symposium on VLSI Circuits, May 30 - Jun. 1, 1991, pp. 129-130.

Urukawa, Yukihiro, et al., "Data-Line Wiring Delay Reduction Techniques for High-Speed BiCMOS SRAM's," Digest of Technical Papers, Session 2-5, 1991 Symposium on VLSI Circuits, May 30 - Jun. 1, 1991, pp. 19-20.

Watanabe, Takao, et al., "Comparison of CMOS and BiCMOS 1-Mbit DRAM Performance," IEEE Journal of Solid State Circuits, vol. 24, No. 3, Jun. 1989, pp. 771-778. (S002211 - S002218; and S043895 - S043902).

Young, I., et al., "A High Performance 256K TTL SRAM Using 0.8um Triple-Diffused BiCMOS With 3V Circuit Techniques," Digest of Technical Papers, Session 2-4, 1991 Symposium on VLSI Circuits, May 30 - Jun. 1, 1991, pp. 17-18.

Defendant Mosel Vitelic, Inc.'s Preliminary Invalidity Contentions, filed in *MOSAID Technologies, Inc.* v. *Micron Technology, Inc.*, et al., Civil Action No. 06-00302, on Aug. 13, 2007.

Defendant ProMOS Technologies, Inc.'s Preliminary Invalidity Contentions, filed in *MOSAID Technologies, Inc.* v *Micron Technology, Inc.*, et al, Civil Action No. 06-00302, in Aug. 13, 2007.

Micron's Invalidity Contentions Pursuant to Patent Rule 3-3, filed in *MOSAID Technologies, Inc* v. *Micron Technology, Inc.*, et al., Civil Action No. 06-00302, on Aug. 13, 2007.

Defendant Powerchip Semiconductor Corp.'s Invalidity Contentions Pursuant to Local Patent Rule 3-3, filed in *MOSAID Technologies, Inc.* v. *Micron Technology, Inc.*, et al., Civil Action No. 06-00302, on Aug. 13, 2007.

Micron's First Amended Complaint for Declaratory Judgment, filed in *Micron, et al* v. *MOSAID Technologies, Inc.*, Civil Action No. 06-04496-JF, N.D. Cal., on Jul. 28, 2008.

PowerChip's First Amended Complaint in Intervention for: Declaration of Noninfringement, Invalidity, Unenforceability, and/or License, filed in *Micron, et al.* v. *MOSAID Technologies, Inc.*, Civil Action No.06-04496-JF, N.D. Cal., on Aug. 12, 2008.

Mosaid's Answer, Affirmative Defenses and Counterclaims to Micron's First Amended Complaint for Declaratory Judgment, filed in *Micron, et al.* v. *MOSAID Technologies, Inc.*, Civil Action No. 06-04496-JF, N.D. Cal., on Aug. 14, 2008.

Mosaid's Notice of Compliance with the May 21, 2008 Order Granting Mosaid Leave to Amend and/or Supplement Preliminary Infringement Contentions, filed in *Micron, et al.* v. *MOSAID Technologies, Inc.*, Civil Action No. 06-04496-JF, N.D. Cal., on Aug. 25, 2008.

Mosaid'Answer, Defenses, and Counterclaims to Powerchip's First Amended Complaint in Intervention, filed in *Micron, et al.* v *MOSAID Technologies, Inc.*, Civil Action No. 06-04496-JF, N.D. Cal., on Aug. 29, 2008.

Micron's Answer to MOSAID's Counterclaims, filed in *Micron, et al.* v. *MOSAID Technologies, Inc.*, Civil Action No. 06-04496-JF, N.D, Cal., on Sep. 8, 2008.

Powerchip's Answer to MOSAID's Counterclaims, filed in *Micron, et al* v. *MOSAID Technologies, Inc.*, Civil Action No. 06-04496-JF, N.D. Cal. on Sep. 18, 2008.

Filed Under Seal. (Documents submitted subject to Protective Order).

* cited by examiner

DYNAMIC MEMORY WORD LINE DRIVER SCHEME

RELATED APPLICATIONS

This application is a Continuation of application Ser. No. 10/791,437, filed on Mar. 2, 2004, now U.S. Pat. No. 7,038,937 which is a Continuation of application Ser. No. 10/463,194, filed on Jun. 17, 2003, now abandoned, which is a Continuation of application Ser. No. 09/919,752, filed on Jul. 31, 2001, now U.S. Pat. No. 6,603,703, which issued on Aug. 5, 2003, which is a Continuation of application Ser. No. 09/548,879, filed on Apr. 13, 2000, now U.S. Pat. No. 6,278,640, which issued on Aug. 21, 2001 which is a Continuation of application Ser. No. 09/123,112, filed on Jul. 27, 1998, now U.S. Pat. No. 6,061,277, which issued on May 9, 2000, which is a Continuation of application Ser. No. 08/705,534, filed on Aug. 29, 1996, now abandoned, which is a Continuation of application Ser. No. 08/611,558, filed on Mar. 6, 1996, now U.S. Pat. No. 5,751,643, which issued on May 12, 1998, which is a Continuation-in-Part of application Ser. No. 08/515,904, filed on Aug. 16, 1995, now U.S. Pat. No. 5,822,253, which issued on Oct. 13, 1998, which is a Continuation of application Ser. No. 08/205,776, filed on Mar. 3, 1994, now abandoned, which is a File Wrapper Continuation of application Ser. No. 08/031,898, filed on Mar. 16, 1993, now abandoned, which is a Continuation of application Ser. No. 07/680,746, filed on Apr. 5, 1991, now U.S. Pat. No. 5,214,602, which issued on May 25, 1993, which relates to Japanese Application No. 9107165, filed on Apr. 5, 1991 and United Kingdom Application No. 9007790.0, filed on Apr. 6, 1990. The entire teachings of the above applications are incorporated herein by reference.

FIELD OF THE INVENTION

This invention relates to CMOS dynamic random access memories (DRAMs), and particularly to word line drivers.

BACKGROUND TO THE INVENTION

Dynamic random access memories are generally formed of a matrix of bit lines and word lines with memory calls located adjacent the intersections of the bit lines and word lines. The memory cells are enabled to provide their stored bits to the bit lines or to permit a write operation by signals carried on the word lines.

Each memory cell is typically formed of a bit storage capacitor connected to a reference voltage and through the source-drain circuit of an "access" field effect transistor to an associated bit line. The gate of the field effect transistor is connected to the word line. A logic signal carried by the word line enables the transistor, thus allowing charge to flow through the source-drain circuit of the transistor to the capacitor, or allowing charge stored on the capacitor to pass through the source-drain circuit of the access transistor to the bit line.

In order for the logic level $V_{dd}$ potential from the bit line to be stored on the capacitor, the word line must be driven to a voltage above $V_{dd}+V_{tn}$, where $V_{tn}$ is the threshold voltage of the access transistor including the effects of back bias.

During the early days of DRAM design, NMOS type FETs, that is, N-channel devices were used exclusively. In order to pass a $V_{dd}+V_{tn}$ level signal to the selected word line, the gate of the pass transistor had to be driven to at least $V_{dd}+2V_{tn}$. Furthermore, to allow sufficient drive to achieve a voltage greater than $V_{dd}+V_{tn}$ on the word line within a reasonable length of time in order to facilitate a relatively fast memory, the gate of the pass transistor is driven to a significantly higher voltage. In such devices, the word line driving signal utilized capacitors in a well-known double-boot strap circuit.

In the above circuit, the boot strapping voltage circuit is designed to exceed the voltage $V_{dd}+2V_{tn}$, in order to ensure that temperature, power supply, and process variations would never allow the pass transistor driving voltage to fall below $V_{dd}+2V_{tn}$.

However, it has been found that in small geometry VLSI memories, the high voltages provided by the boot-strap circuits can exceed the tolerable voltages in the memory, thus adversely affecting reliability.

SUMMARY OF THE INVENTION

The present invention is a circuit which accurately controls the word line (pass transistor gate) driving voltage to a voltage which is both controlled and is not significantly greater than is needed to drive the word line. The elements of the present invention eliminate the need for a double-boot-strapping circuit, and ensure that no voltages exceed that necessary to fully turn on a memory cell access transistor. Accordingly, voltages in excess of that which would reduce reliability are avoided, and accurate driving voltages are obtained.

According to an embodiment of the invention a dynamic random access memory (DRAM) is comprised of word lines, memory cells having enable inputs connected to the word lines, apparatus for receiving word line selecting signals at first logic levels $V_{ss}$ and $V_{dd}$, and for providing a select signal at levels $V_{ss}$ and $V_{dd}$, a high voltage supply source $V_{pp}$ which is higher in voltage than $V_{dd}$, a circuit for translating the select signals at levels $V_{ss}$ and $V_{dd}$ to levels $V_{ss}$ and $V_{pp}$ and for applying it directly to the word lines for application to the enable inputs whereby an above $V_{dd}$ voltage level word line is achieved without the use of double boot-strap circuits.

According to another embodiment, a dynamic random access memory (DRAM) is comprised of bit lines and word lines, memory cells connected to the bit lines and word lines, each memory cell being comprised of an access field effect transistor (FET) having its source-drain circuit connected between a bit line and a bit charge storage capacitor, the access field effect transistor having a gate connected to a corresponding word line; a high supply voltage source $V_{pp}$; a circuit for selecting the word line and a circuit having an input driven by the selecting apparatus for applying the $V_{pp}$ supply voltage to the word line.

BRIEF INTRODUCTION TO THE DRAWINGS

A better understanding of the invention will be obtained by reference to the detailed description below, in conjunction with the following drawings, in which:

FIG. 1 is a schematic diagram of the invention.

DESCRIPTION OF A PREFERRED EMBODIMENT OF THE INVENTION

Turning now to FIG. 1, a CMOS DRAM is comprised of word lines, represented by word line 1 and bit lines, represented by bit lines 2A, 2B, etc. Access transistors 3A, 3B have their gates connected to the word line; their sources are connected to bit charge storing capacitors 4A, 4B, etc. which are also connected to ground. The drains of access transistors 3A, 3B, etc. are connected to the bit lines 2A, 2B, etc.

With the application of a logic signal of $V_{dd}+V_{tn}$ to the gate of transistor 3A, 3B, etc., $V_{dd}$ level on the bit line 2A, 2B, etc. is fully transferred to the associated capacitor 4A, 4B, etc.

during the writing cycle. In the prior art it was necessary to apply a voltage greater than $V_{dd}+2V_{tn}$ to the gate of an N-channel pass transistor in order to ensure that a voltage in excess of $V_{dd}+V_{tn}$ would be available at the gates of transistors 3A, 3B, etc.

The combination of a bit storing charge capacitor, e.g. 4A, with an associated access transistor, e.g. 3A, forms a memory cell in prior art DRAMs.

The word line is selected by means of addresses $A_{ij}$ applied to the inputs of a NAND gate 5. In the prior art a double boot-strap circuit was connected between the output of NAND gate 5 and the word line.

In accordance with the present invention a voltage $V_{pp}$ which is higher than the logic level $V_{dd}+V_{tn}$ is utilized. A level shifter 6 is formed of a pair of cross coupled P-channel transistors 7A and 7B. The sources of transistors 7A and 7B are connected to the voltage source $V_{pp}$. The level shifter defines a first and a second control node, respectively 8A and 8B.

The output of NAND gate 5 is connected through an inverter 9 to the gate of an N-channel FET 10. FET 10 has its source connected to ground and its drain connected to control node 8A.

The output of NAND gate 5 is connected to the gate of an N-channel FET 11, which has its source connected to ground and its drain connected to control node 8B. A third N-channel FET 12 has its source connected to ground, its drain connected to the drain of transistor 11, and its gate to control node 8A.

Control node 8A (or a buffered version of control node 8A) is applied to the gate of pass transistor 14A and pull down transistor 13A. The source of pass transistor 14A is connected to $V_{pp}$ or to a secondary decoder output which provides a $V_{ss}$ or $V_{pp}$ level output; its drain to word line 1. The source of pull down transistor 13A is connected to ground; the drain is connected to word line 1.

In operation, assume that the word line 1 has not been selected. At least one address input of NAND gate 5 is low, causing the output of NAND gate 5 to be high, and the output of inverter 9 to be low. Transistor 11 is enabled, pulling node 8B to ground. Transistor 10 is disabled, allowing transistor 7A to charge node 8A to $V_{pp}$. Transistor 12 is thus enabled ensuring that node 8A is pulled high. The $V_{pp}$ level node 8A disables the pass device 14A and enables pull down transistor 13A so that word line 1 is held at ground. Thus transistors 3A and 3B are not enabled and are not conducting. The charge stored on capacitors 4A and 4B are thus maintained, and are not read to the bit lines.

Assume now that word line 1 is selected. Logic high level address signals at the voltage level $V_{dd}$ are applied to the inputs of NAND gate 5. The output of the NAND gate thus goes to low level. The output of inverter 9 changes to high level, transistor 10 is enabled, and pulls node 8A toward ground. This causes transistor 7B to be enabled, and pull node 8B toward $V_{pp}$. This causes transistor 7A to be disabled so that node 8A is pulled to ground, disabling transistor 12 and allowing transistor 7B to charge node 8B to $V_{pp}$. The ground level voltage on node 8A disables pull down transistor 13A, and enables the pass transistor 14A so that the word line 1 is driven to a $V_{pp}$ level. The voltage on the word line is thus controlled, and depending on whether the word line is selected or not, it switches between ground and $V_{pp}$. With the voltage $V_{pp}$ being controlled to $V_{dd}+V_{tn}$, the voltage at the gates of the cell access transistors 3A and 3B is certain to be $V_{dd}+V_{tn}$. However the voltage $V_{pp}$ is selected to be less than a voltage that would be in excess of that which would deteriorate reliability of the DRAM.

A person understanding this invention may now conceive of alternative structures and embodiments or variations of the above. All of those which fall within the scope of the claims appended hereto are considered to be part of the present invention.

What is claimed is:

1. A dynamic random access memory comprising:
a voltage supply having a controlled high supply voltage level;
word lines;
memory cells, each comprising a charge storage capacitor and an access transistor for storing a logic level on the storage capacitor, the access transistor having an enable input connected to a word line; and
a word line selection circuit comprising a pair of cross-coupled transistors coupled drain-to-gate and having respective sources receiving current from the controlled high supply voltage level, the selection circuit receiving logic signals having only levels that are less than the controlled high supply voltage level to drive a selected word line to the controlled high supply voltage level.

2. A dynamic random access memory as claimed in claim 1 wherein the selected word line is driven to the controlled high supply voltage level through an additional transistor enabled from the drain of one of the cross-coupled transistors.

3. A dynamic random access memory as claimed in claim 1 wherein the selected word line is driven to the controlled high supply voltage level from a secondary decoder output through an additional transistor enabled from the drain of one of the cross-coupled transistors.

4. A dynamic random access memory as claimed in claim 1 wherein the cross-coupled transistors are P-channel FETs and the drains of the cross-coupled transistors are pulled down by respective N-channel FETs.

5. A dynamic random access memory comprising:
a voltage supply having a controlled high supply voltage level Vpp;
word lines that enable memory cell access transistors; and
memory cells, each comprising a charge storage capacitor and an access transistor for storing a logic level on the storage capacitor, the access transistor having an enable input coupled to a word line; and
a word line selection circuit comprising a pair of cross-coupled transistors having their respective sources directly connected to the controlled high supply voltage level Vpp, the selection circuit receiving logic signals having only logic voltage levels that are less than the controlled voltage level Vpp to produce a control signal selectively having the controlled high supply voltage level Vpp or a Vss voltage level, the control signal selectively driving the word line to the controlled high supply voltage level Vpp.

6. A dynamic random access memory as claimed in claim 5 wherein the selected word line is driven to the controlled high supply voltage level Vpp through an additonal transistor enabled from the drain of one of the cross-coupled transistors.

7. A dynamic random access memory as claimed in claim 5 wherein the selected word line is driven to the controlled high supply voltage level Vpp from a secondary decoder output through an additional transistor enabled from the drain of one of the cross-coupled transistors.

8. A dynamic random access memory as claimed in claim 5 wherein the cross-coupled transistors are P-channel FETs and the drains of the cross-coupled transistors are pulled down by respective N-channel FETs.

9. A method of selecting word lines and writing to memory cells in a dynamic random access memory to store a voltage level in a memory cell comprising:

supplying a controlled high supply voltage level that is greater than the voltage level stored in the memory cell to a level shifter circuit, the level shifter circuit comprising a pair of cross-coupled transistors connected drain-to-gate and having respective sources receiving current from the controlled high supply voltage;

providing logic signals having only logic levels that are less than the controlled high supply voltage level to the level shifter circuit to selectively produce a control signal having a logic state at the controlled high supply voltage level and another logic state at a low voltage level;

driving a selected dynamic random access memory word line to the controlled high supply voltage level in response to the control signal; and writing a voltage from a bit line into a memory cell capacitor associated with the selected word line to store a voltage representative of a logic level in the selected memory cell.

10. A method as claimed in claim 9 wherein the selected word line is driven by enabling an additional transistor from the drain of one of the cross-coupled transistors, the additional transistor being coupled between the controlled high supply voltage level and the word line.

11. A method as claimed in claim 10 wherein the drain of the additional transistor is coupled to the word line.

12. A method as claimed in claim 10 wherein the additional transistor is a P-channel FET.

13. A method as claimed in claim 9 wherein the selected word line is driven by enabling an additional transistor from the drain of one of the cross-coupled transistors, the additional transistor being coupled between a secondary decoder output, having an output voltage level at the controlled high supply voltage level, and the word line.

14. A method as claimed in claim 13 wherein the additional transistor is a P-channel FET.

15. A method as claimed in claim 13 wherein the drain of the additional transistor is coupled to the word line.

16. A method as claimed in claim 9 wherein the cross-coupled transistors are P-channel FETs and the drains of the cross-coupled transistors are pulled down by respective N-channel FETs.

17. A method as claimed in claim 9 wherein the selected word line is driven without using a double bootstrapping circuit.

18. A method of selecting word lines and writing to memory cells in a dynamic random access memory to store a voltage level in a memory cell comprising:

supplying a controlled high supply voltage level that is greater than the voltage level stored in the memory cell to a level shifter circuit, the level shifter circuit comprising a pair of cross-coupled transistors connected drain-to-gate and having respective sources coupled to the controlled high supply voltage level;

providing logic signals having only logic levels that are less than the controlled high supply voltage level to the level shifter circuit to selectively produce a control signal having a logic state at the controlled high supply voltage level and another logic state at a low voltage level;

driving a selected dynamic random access memory word line from a decoded secondary output at the controlled high supply voltage level in response to the control signal; and writing a voltage from a bit line into a memory cell capacitor associated with the selected word line to store a voltage representative of a logic level in the selected memory cell.

19. A method of selecting word lines and writing to memory cells in a dynamic random access memory, the method comprising:

supplying a controlled high supply voltage level Vpp from a high voltage supply to a level shifter circuit, the level shifter circuit comprising at least first and second transistors having their respective sources directly connected to the controlled high supply voltage level Vpp, the drain of the first transistor applying current to a first node, the drain of the second transistor applying current to a second node, the first and second transistors being gated from the second and first nodes, respectively;

providing a decoded address input signal, selectively having only logic voltage levels that are less than the controlled voltage level Vpp, to the level shifter circuit to produce a control signal selectively having the controlled high supply voltage level Vpp or a Vss voltage level;

selectively driving the word line to the controlled high supply voltage level Vpp in response to the control signal; and writing a voltage from a bit line into a memory cell capacitor associated with the selected word line to store a voltage representative of a logic level in the selected memory cell.

20. A method as claimed in claim 19 wherein the selected word line is driven by enabling an additional transistor from the drain of one of the first and second transistors, the additional transistor being coupled between the controlled high supply voltage level Vpp and the word line.

21. A method as claimed in claim 19 wherein the selected word line is driven by enabling an additional transistor from the drain of one of the first and second transistors, the additional transistor being coupled between a secondary decoder output, having an output voltage level at the controlled high supply voltage level Vpp, and the word line.

22. A method as claimed in claim 19 wherein the first and second transistors are P-channel FETs and the drains of the first and second transistors are pulled down by respective N-channel FETs.

23. A method for storing a voltage level in a memory cell coupled to a word line and a bit line of a dynamic random access memory, the method comprising:

providing a controlled high supply voltage level that is greater than the voltage level stored in a memory cell to a level shifter, the level shifter comprising a pair of transistors, the drains and gates being cross-coupled to each other, the source of each of the transistors being provided with the controlled high supply voltage;

providing logic signals to the level shifter for producing a control signal, each of the logic signal having two levels, the higher level of which is less than the controlled high supply voltage level, the control signal having a logic state at the controlled high supply voltage level;

selectively driving a word line to the controlled high supply voltage level in response to the control signal; and writing a voltage from a bit line into a memory cell capacitor associated with the driven word line to store a voltage representative of a logic level in the memory cell.

24. A method as claimed in claim 23 wherein the step of selectively driving comprises enabling an additional transistor to pass the controlled high supply voltage level to the word line in response to the control signal.

25. A method as claimed in claim 24 wherein the step of enabling comprises enabling the additional transistor comprising a P-channel FET.

26. A method as claimed in claim 23 wherein the step of selectively driving comprises enabling an additional transistor to pass the controlled high supply voltage from a secondary decoder output to the word line in response to the control signal, the secondary decoder output having an output voltage level at the controlled high supply voltage level.

27. A method as claimed in claim 26 wherein the step of enabling comprises enabling the additional transistor comprising a P-channel FET.

28. A method as claimed in claim 23 wherein the pair of transistors comprises a pair of P-channel FETs, the drains of which are pulled down by respective N-channel FETs.

29. A method as claimed in claim 23 wherein the step of selectively driving is performed without using a double bootstrapping circuit.

30. A dynamic random access memory comprising:
a voltage supply having a controlled high supply voltage level;
word lines;
memory cells, each comprising a charge storage capacitor and an access transistor for storing a logic level on the storage capacitor, the access transistor having an enable input coupled to a word line; and
a word line selection circuit comprising a pair of cross-coupled transistors and pull down transistors coupled to the drains of the cross-coupled transistors, the selection circuit receiving logic signals having only logic levels that are less than the controlled high supply voltage level to drive a selected word line to the controlled high supply voltage level, the logic signals being applied only to the pull down transistors.

31. A dynamic random access memory as claimed in claim 30 wherein the selected word line is driven to the controlled high supply voltage level through an additional transistor enabled from the drain of one of the cross-coupled transistors.

32. A dynamic random access memory as claimed in claim 30 wherein the selected word line is driven to the controlled high supply voltage level from a secondary decoder output through an additional transistor enabled from the drain of one of the cross-coupled transistors.

33. A dynamic random access memory as claimed in claim 30 wherein the cross-coupled transistors are P-channel FETs and the drains of the cross-coupled transistors are pulled down by respective N-channel FETs.

34. A method of selecting word lines and writing to memory cells in a dynamic random access memory to store a voltage level in a memory cell comprising:
supplying a controlled high supply voltage level that is greater than the voltage level stored in the memory cell to a level shifter circuit, the level shifter circuit comprising a pair of cross-coupled transistors and pull down transistors coupled to the drains of the cross-coupled transistors;
providing selection logic signals having only logic levels that are less than the controlled high supply voltage level to the level shifter circuit to selectively produce a control signal having a logic state at the controlled high supply voltage level and another logic state at a low voltage level, the selection logic signals being coupled only to the pull down transistors;
driving a selected dynamic random access memory word line to the controlled high supply voltage level in response to the control signal; and
writing a voltage from a bit line into a memory cell capacitor associated with the selected word line to store a voltage representative of a logic level in the selected memory cell.

35. A method as claimed in claim 34 wherein the selected word line is driven by enabling an additional transistor from the drain of one of the cross-coupled transistors, the pass transistor being coupled between the controlled high supply voltage level and the word line.

36. A method as claimed in claim 35 wherein the drain of the additional transistor is coupled to the word line.

37. A method as claimed in claim 35 wherein the additional transistor is a P-channel FET.

38. A method as claimed in claim 34 wherein the selected word line is driven by enabling an additional transistor from the drain of one of the cross-coupled transistors, the additional transistor being coupled between a secondary decoder output, having an output voltage level at the controlled high supply voltage level, and the word line.

39. A method as claimed in claim 38 wherein the drain of the additional transistor is coupled to the word line.

40. A method as claimed in claim 38 wherein the additional transistor is a P-channel FET.

41. A method as claimed in claim 34 wherein the cross-coupled transistors are P-channel FETs and the drains of the cross-coupled transistors are pulled down by respective N-channel FETs.

42. A method as claimed in claim 34 wherein the selected word line is driven without using a double bootstrapping circuit.

43. A method of selecting word lines and writing to memory cells in a dynamic random access memory to store a voltage level in a memory cell comprising:
supplying a controlled high supply voltage level that is greater than the voltage level stored in the memory cell to a level shifter circuit, the level shifter circuit comprising a pair of cross-coupled transistors and pull down transistors coupled to the drains of the cross-coupled transistors;
providing lower voltage level logic signals having only logic levels that are less than the controlled high supply voltage level to the level shifter circuit to selectively produce a control signal having a logic state at the controlled high supply voltage level and another logic state at a low voltage level, the lower voltage level logic signals being applied only to the pull down transistors;
driving a selected dynamic random access memory word line from a decoded secondary output at the controlled high supply voltage level in response to the control signal; and
writing a voltage from a bit line into a memory cell capacitor associated with the selected word line to store a voltage representative of a logic level in the selected memory cell.

* * * * *